257/40, 72, 76, 89, 98, E27.12, 257/E27.119; 313/504; 428/332; 438/46, 438/47, 488

(12) United States Patent
Schicktanz et al.

(10) Patent No.: US 9,246,121 B2
(45) Date of Patent: Jan. 26, 2016

(54) ORGANIC LIGHT-EMITTING DIODE

(75) Inventors: Simon Schicktanz, Regensburg (DE); Daniel Steffen Setz, Böblingen (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/350,802

(22) PCT Filed: Aug. 6, 2012

(86) PCT No.: PCT/EP2012/065350
§ 371 (c)(1),
(2), (4) Date: Jul. 7, 2014

(87) PCT Pub. No.: WO2013/053508
PCT Pub. Date: Apr. 18, 2013

(65) Prior Publication Data
US 2014/0361279 A1    Dec. 11, 2014

(30) Foreign Application Priority Data
Oct. 12, 2011    (DE) .......................... 10 2011 084 363

(51) Int. Cl.
*H01L 33/00*    (2010.01)
*H01L 27/32*    (2006.01)
*H01L 51/52*    (2006.01)
*H01L 51/50*    (2006.01)

(52) U.S. Cl.
CPC ............... *H01L 51/52* (2013.01); *H01L 51/50* (2013.01); *H01L 2251/5361* (2013.01); *H01L 2251/5392* (2013.01)

(58) Field of Classification Search
CPC . H01L 51/50; H01L 51/52; H01L 2281/5361; H01L 2251/5392
USPC ....... 257/40, 72, 76, 89, 98, E27.12, 257/E27.119; 313/504; 428/332; 438/46, 438/47, 488
See application file for complete search history.

(56) References Cited

U.S. PATENT DOCUMENTS

| | | | | |
|---|---|---|---|---|
| 6,013,384 A | * | 1/2000 | Kido et al. | 428/690 |
| 6,433,355 B1 | * | 8/2002 | Riess et al. | 257/40 |
| 7,693,201 B2 | * | 4/2010 | Albrecht et al. | 372/50.1 |

(Continued)

FOREIGN PATENT DOCUMENTS

| | | |
|---|---|---|
| CN | 101916769 A | 12/2010 |
| CN | 102163671 A | 8/2011 |
| DE | 102009013685 A1 | 9/2010 |

*Primary Examiner* — Dao H Nguyen
(74) *Attorney, Agent, or Firm* — McDermott Will & Emery LLP

(57) ABSTRACT

In at least one embodiment, the organic light-emitting diode (10) comprises a carrier substrate (1) and a first electrode (21). Furthermore, the organic light-emitting diode (10) comprises an organic layer sequence (3) having at least one active layer (30) for generating an electromagnetic radiation. The organic layer sequence (3) is situated at a side of the first electrode (21) which faces away from the carrier substrate (1). Moreover, the organic light-emitting diode (10) comprises a second electrode (22), which is mounted at a side of the organic layer sequence (2) which faces away from the carrier substrate (1). Furthermore, the organic light-emitting diode (10) comprises a protective diode (4) designed for protection against damage from electrostatic discharges. The protective diode (4) is mounted on the carrier substrate (1) and is situated at the same main side (11) of the carrier substrate (1) as the organic layer sequence (3).

13 Claims, 2 Drawing Sheets

(56) References Cited

U.S. PATENT DOCUMENTS

| | | |
|---|---|---|
| 8,319,250 B2 * | 11/2012 | Rode et al. .................. 257/99 |
| 8,575,644 B2 * | 11/2013 | Jeong et al. ................. 257/99 |
| 2004/0095300 A1 * | 5/2004 | So et al. ..................... 345/82 |
| 2005/0179042 A1 | 8/2005 | Yang et al. |
| 2006/0066223 A1 | 3/2006 | Pschenitzka |
| 2008/0143249 A1 | 6/2008 | Lee et al. |
| 2008/0273280 A1 | 11/2008 | Chen et al. |
| 2009/0047775 A1 | 2/2009 | Yamazaki et al. |
| 2009/0057692 A1 * | 3/2009 | Lee ............................ 257/89 |
| 2009/0066240 A1 | 3/2009 | Hunze et al. |
| 2009/0146929 A1 | 6/2009 | Kim et al. |
| 2011/0068688 A1 | 3/2011 | Choi et al. |
| 2012/0305902 A1 * | 12/2012 | So ............................. 257/40 |

* cited by examiner

ORGANIC LIGHT-EMITTING DIODE

SUMMARY

An organic light-emitting diode is specified.

One object to be achieved is to specify an organic light-emitting diode which is protected against damage resulting from electrostatic discharges.

In accordance with at least one embodiment of the organic light-emitting diode, the latter comprises a carrier substrate. The carrier substrate can comprise one or more of the following materials or material classes or can consist of one or more of the stated materials or material classes: a glass, quartz, plastic films, a metal, metal films, a semiconductor wafer, for example composed of silicon. Particularly preferably, the carrier substrate is transmissive to a radiation generated by the organic light-emitting diode during operation. The carrier substrate can be transparent or else comprise a diffusion medium such as scattering particles or a roughening.

In accordance with at least one embodiment of the organic light-emitting diode the latter comprises a first electrode. The first electrode is mounted at the carrier substrate. By way of example, the first electrode is in direct physical contact with a material of the carrier substrate or is at a distance of at most 500 nm or of at most 200 nm from the material of the carrier substrate.

Preferably, the first electrode is embodied as an anode and can comprise a hole-injecting material. The material of the first electrode is, in particular, a transparent conductive oxide, TCO for short. Such materials are generally metal oxides, such as, for example, zinc oxide, tin oxide, cadmium oxide, titanium oxide, indium oxide or indium tin oxide, ITO for short. Alongside binary metal-oxygen compounds, such as, for example, ZnO or SnO, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition. Optionally, a material of the first electrode can also be p-doped or n-doped.

In accordance with at least one embodiment, the organic light-emitting diode comprises an organic layer sequence. The organic layer sequence comprises at least one active layer provided for generating an electromagnetic radiation during the operation of the light-emitting diode. The active layer is based on or therefore consists of at least one organic material. A radiation generated by the active layer during the operation of the light-emitting diode has a wavelength of, in particular, between 350 nm and 800 nm inclusive, preferably between 400 nm and 700 nm inclusive.

The organic layer sequence preferably has a plurality of layers, in particular a p-doped organic layer and an n-doped organic layer. By way of example, the active layer is mounted between these organic layers.

Layers of the organic layer sequence can comprise organic polymers, organic oligomers, organic monomers, organic small non-polymeric molecules, called small molecules or combinations thereof. Preferably, all layers of the organic layer sequence are formed from the materials mentioned.

Alongside the p-doped layer and the n-doped layer and also the active layer, the organic layer sequence can have further functional layers. By way of example, the organic layer sequence comprises a hole transport layer and/or a hole injection layer. These layers comprise, for example, tertiary amines, carbazole derivatives, conductive polyaniline or polyethylene dioxythiophene. Further layers of the layer sequence can be embodied as an electron transport layer and/or as an electron injection layer. Furthermore, the layer sequence can comprise barrier layers for holes and/or for electrons.

In accordance with at least one embodiment of the light-emitting diode the organic layer sequence is situated at a side of the first electrode which faces away from the carrier substrate. The organic layer sequence is mounted above the first electrode, for example, and can be in direct physical contact with the first electrode. It is possible for the organic layer sequence with the active layer to completely cover the first electrode, or else for the first electrode to extend completely between the organic layer sequence and the carrier substrate.

In accordance with at least one embodiment, the organic light-emitting diode comprises a second electrode. The second electrode is situated at a side of the organic layer sequence which faces away from the carrier substrate. It is possible for the second electrode to completely cover the organic layer sequence, or for the organic layer sequence to extend completely between the second electrode and the carrier substrate. The second electrode is preferably in direct physical contact with the organic layer sequence.

The second electrode is preferably embodied as a cathode. In particular, the second electrode comprises an electron-injecting material. By way of example, the second electrode comprises or consists of one or more of the following materials: aluminum, barium, indium, silver, gold, magnesium, calcium, lithium. Alternatively or additionally, the second electrode can also comprise one or more of the TCOs mentioned above. Additionally or alternatively, the second electrode can likewise be embodied as light-transmissive or, preferably, reflective.

Furthermore, it is possible for the first electrode to be embodied as a cathode and for the second electrode to be embodied as an anode.

In accordance with at least one embodiment, the organic light-emitting diode comprises a protective diode. The protective diode is designed for protection against damage from electrostatic discharges. In other words, the protective diode is an ESD protective diode. The protective diode is mounted on the carrier substrate. The protective diode is situated at the same main side of the carrier substrate as the organic layer sequence.

In at least one embodiment, the organic light-emitting diode, OLED for short, comprises a carrier substrate and a first electrode, which is mounted at the carrier substrate. Furthermore, the organic light-emitting diode comprises an organic layer sequence having at least one active layer for generating an electromagnetic radiation. The organic layer sequence is situated at a side of the first electrode which faces away from the carrier substrate. Moreover, the organic light-emitting diode comprises a second electrode, which is mounted at a side of the organic layer sequence which faces away from the carrier substrate. Furthermore, the organic light-emitting diode comprises a protective diode designed for protection against damage from electrostatic discharges. The protective diode is mounted on the carrier substrate and is situated at the same main side of the carrier substrate as the organic layer sequence.

As a result of the application of a voltage and/or a current in the reverse direction of the organic layer sequence, the latter can be damaged or destroyed. In this case, either the organic layer sequence is immediately short-circuited or latent leakage current paths occur, which can lead to the lifetime of the organic light-emitting diode being shortened. Such voltages in the reverse direction can be caused by an incorrect polarity of the connections of the organic light-emitting diode or by electrostatic discharges.

One possibility for protection against electrostatic discharge is for an additional, separate ESD protective diode to be connected in parallel with the organic light-emitting diode. Such a protective diode is generally soldered to a printed circuit board, wherein the organic light-emitting diode is likewise soldered to the printed circuit board. Mounting a separate ESD protective diode directly on the carrier substrate of the organic light-emitting diode is generally difficult since, on account of a surface constitution, soldering tin typically adheres only poorly to contact areas of the carrier substrate. Such separate ESD protective diodes are generally based on inorganic materials.

In accordance with at least one embodiment of the organic light-emitting diode the protective diode is formed by an organic layer stack or comprises such a layer stack. The organic layer stack partly or completely comprises the same materials or partly or completely consists of the same materials as the organic layer sequence. By way of example, the protective diode comprises at least two or exactly two layers which, in terms of their material composition and/or in terms of their thickness, correspond to layers from the organic layer sequence or are such layers.

In accordance with at least one embodiment of the organic light-emitting diode the protective diode is situated laterally alongside the organic layer sequence on the carrier substrate. In other words, the organic layer sequence with the active layer and the protective diode, in particular the organic layer stack of the protective diode, then do not overlap, as seen in a plan view of the main side of the carrier substrate.

In accordance with at least one embodiment of the light-emitting diode at least two layers of the layer stack of the protective diode are applied on the carrier substrate in an opposite order to that which is the case in the organic layer sequence having the active layer. By way of example, the organic layer sequence having the active layer comprises a p-doped layer and an n-doped layer, wherein the p-doped layer is situated between the carrier substrate and the n-doped layer. In the layer stack of the protective diode, the n-doped layer is then situated between the p-doped layer and the carrier substrate.

In accordance with at least one embodiment of the organic light-emitting diode the organic layer stack of the protective diode is situated partly or completely between a partial region of the first electrode and a partial region of the second electrode. In this case, the corresponding partial region of the first electrode is preferably situated between the carrier substrate and the layer stack of the protective diode.

These partial regions of the first electrode and of the second electrode which delimit the layer stack of the protective diode in directions perpendicular to the main side of the carrier substrate can be formed by the same materials as the further parts of the first and second electrodes, which are in direct contact with the organic layer sequence having the active layer. The partial regions of the first electrode and of the second electrode which make contact with the protective diode can either be separated from the parts of the first and second electrodes which are in contact with the organic layer sequence having the active layer, or else be connected to said parts, for example by means of a continuous material connection of a material of the corresponding electrode.

In accordance with at least one embodiment of the light-emitting diode the layer stack of the protective diode has at least two layers which are applied to the carrier substrate in the same order as in the organic layer sequence having the active layer. By way of example, both the layer stack of the protective diode and the organic layer sequence having the active layer have in each case an n-doped layer and a p-doped layer, wherein the p-doped layer is situated in each case between the carrier substrate and the n-doped layer.

In accordance with at least one embodiment of the organic light-emitting diode a partial region of the first electrode is situated at a top side of the layer stack of the protective diode facing away from the carrier substrate. Alternatively, it is possible for the first electrode to be electrically connected to the top side of the protective diode. It is possible for said partial region of the first electrode to extend completely or partly over the top side of the protective diode. Said partial region of the first electrode can then be formed from the same material as the remaining parts of the first electrode which are situated between the organic layer sequence having the active layer and the carrier substrate.

In accordance with at least one embodiment of the organic light-emitting diode a partial region of the second electrode is situated between the layer stack of the protective diode and the carrier substrate, and the layer stack of the protective diode is situated between a partial region of the first electrode and the carrier substrate. In other words, the first electrode and the second electrode are then interchanged in the region of the protective diode.

As also in all of the embodiments, the partial regions of the first electrode and of the second electrode which are situated at the layer stack of the protective diode can have the same or substantially the same material composition as the parts of the first electrode and of the second electrode which are situated at the organic layer sequence having the active layer. In particular, all partial regions and parts of the first electrode can be embodied as anode and all partial regions and parts of the second electrode can be embodied as cathode.

In accordance with at least one embodiment of the organic light-emitting diode the protective diode and the layer stack of the protective diode is free of an active layer provided for generating radiation. In other words, the protective diode is not designed to generate electromagnetic radiation in particular in the visible spectral range during operation or outside operation of the organic light-emitting diode.

In accordance with at least one embodiment of the organic light-emitting diode the organic layer sequence comprises at least two active layers provided for generating radiation during the operation of the light-emitting diode. At least one charge generation layer, CGL for short, is then situated between two neighboring active layers. Such layers are disclosed for example in the documents US 2008/0143249 A1 and US 2009/0146929 A1. The disclosure content of said documents with regard to the charge generation layers and with regard to further constituents of the organic light-emitting diode is incorporated by reference.

In accordance with at least one embodiment of the organic light-emitting diode the protective diode comprises the same material or the same materials as the charge generation layer or consists of at least one or a plurality of said materials.

In accordance with at least one embodiment of the organic light-emitting diode the layer stack of the protective diode is constructed completely from layers which are based on organic materials or consist thereof. In particular, all constituents of the protective diode, with the exception of the first electrode and the second electrode, which constitute electrical contacts for the protective diode, are produced from organic materials or are based on organic materials.

In accordance with at least one embodiment of the organic light-emitting diode a thickness of the layer stack of the protective diode, in a direction away from the main side of the carrier substrate, is equal to a thickness of the organic layer sequence having the active layer. The thicknesses of the layer stack and of the organic layer sequence are preferably identical with a tolerance of at most 50% or at most 30% or of at most 15%.

In accordance with at least one embodiment of the organic light-emitting diode there is at least one plane parallel to the main side of the carrier substrate which intersects both the layer stack of the protective diode and the organic layer sequence having the active layer. Preferably, main extension directions of the layer stack and also of the layer sequence lie in said plane. Said plane is, in particular, a virtual plane.

Furthermore, it is possible for one of the electrodes which make contact with the protective diode and one of the electrodes which make contact with the organic layer sequence to lie in a plane parallel to the main side of the carrier substrate, in particular in the case of the two electrodes which are situated between the carrier substrate and the layer stack or the organic layer sequence. It is likewise possible for the electrodes which make contact with the layer stack and the organic layer sequence and are situated at sides of the layer stack of the protective diode and of the organic layer sequence which face away from the carrier substrate to be intersected by a plane parallel to the main side of the carrier substrate.

In accordance with at least one embodiment of the organic light-emitting diode the first electrode and/or the second electrode are oriented parallel to the main side of the carrier substrate. This does not rule out the electrodes having small regions which overcome a height difference, caused by the thickness of the layer stack of the protective diode or by the thickness of the organic layer sequence, and which run transversely with respect to the main side.

In accordance with at least one embodiment of the organic light-emitting diode the latter comprises, apart from the in particular exactly one protective diode, no further devices for protection against damage resulting from electrostatic discharges. In other words, the protective diode, which is preferably based on organic materials, is then the only ESD protection of the organic light-emitting diode.

An organic light-emitting diode described here is explained in greater detail below on the basis of exemplary embodiments with reference to the drawing. In this case, identical reference signs indicate identical elements in the individual figures. In this case, however, relations to scale are not illustrated; rather, individual elements may be illustrated with an exaggerated size in order to afford a better understanding.

DETAILED DESCRIPTION

Figure 1:
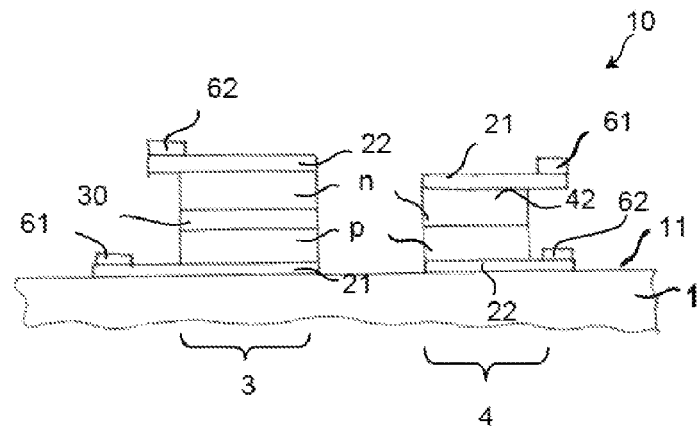
FIG. 1 shows a schematic sectional illustration of one exemplary embodiment of an organic light-emitting diode described here.

FIG. 1 shows one exemplary embodiment of an organic light-emitting diode 10 in a sectional illustration. The organic light-emitting diode 10 comprises a carrier substrate 1. The carrier substrate 1 is light-transmissive to a radiation generated by the organic light-emitting diode 10 during operation. The carrier substrate 1 can be embodied in a diffusively scattering fashion and thus light-scattering fashion, or else can be transparent. An organic layer sequence 3 having an active layer 30 and a protective diode 4 having an organic layer stack are mounted on a planar main side 11 of the carrier substrate 1.

The organic layer sequence 3 is provided for generating an electromagnetic radiation during the operation of the organic light-emitting diode 10. The active layer 30 is situated between an n-doped layer n and a p-doped layer p. Further layers such as barrier layers or charge carrier injection layers are not illustrated in the figures.

The protective diode 4 likewise has a p-doped layer p and an n-doped layer n. These layers n, p of the protective diode 4 are mounted in the same order as the layers n, p of the organic layer sequence 3 and are furthermore preferably formed by the same materials. In this case, the protective diode 4 is free of the active layer 30.

A part of a first electrode 21 is situated between the organic layer sequence 3 and the carrier substrate 1. The first electrode 21 is preferably embodied as an anode and formed by a transparent conductive oxide such as ITO, for example. A part of a second electrode 22, which is preferably embodied as a cathode and, moreover, preferably comprises or consists of a reflective metal, is situated at a side facing away from the organic layer sequence 3. Electrical contact areas 61, 62 for externally making electrical contact with the organic light-emitting diode 10 are respectively mounted at the electrodes 21, 22. The contact areas 61, 62 are based, for example, on one of the following materials: Ag, Al, Au, Cu, Cr, Mg. Preferably, the contact areas 61, 62 are formed from AgMg or have a layer sequence comprising Cr—Al—Cr or comprising Ag—Al—Ag.

A part of the second electrode 22, which is embodied as a cathode, is situated between the carrier substrate 1 and the layer stack of the protective diode 4. A partial region of the first electrode 21, embodied as an anode, is situated at a top side 42 of the protective diode 4 facing away from the carrier substrate 1. All regions of the first electrode 21 can be formed from the same material. Furthermore, all regions of the second electrode 22 can also be formed from the same material and, in the context of the production tolerances, have the same thickness. In other words, the first electrode 21 and the second electrode are interchanged at the protective diode 4, in comparison with the arrangement of the electrodes 21, 22 at the organic layer sequence 3 having the active layer 30.

Figure 2:
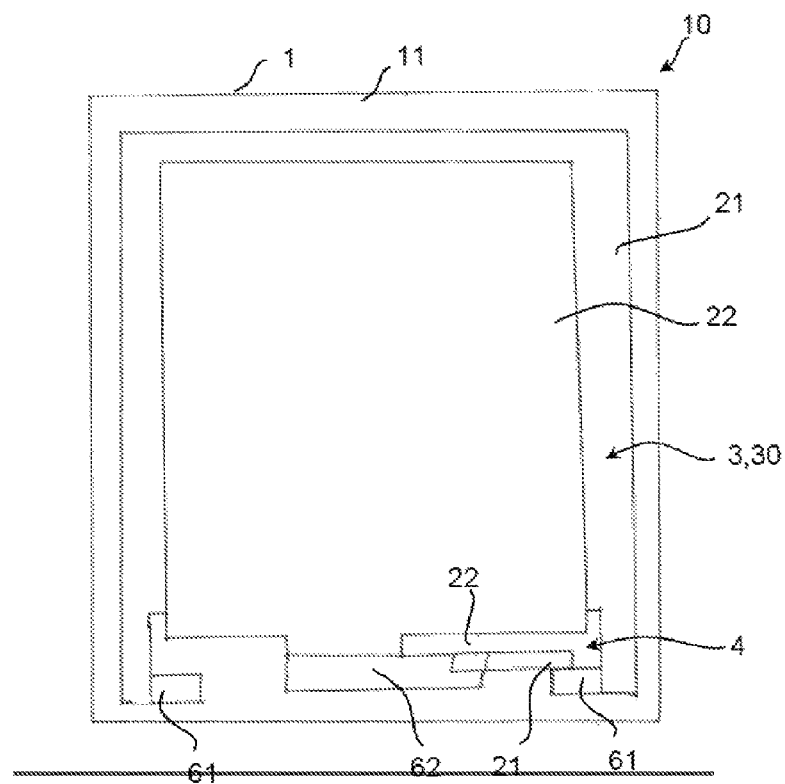
FIG. 2 shows a schematic plan view of one exemplary embodiment of an organic light-emitting diode described here.

FIG. 2 shows a schematic plan view of the organic light-emitting diode 10 in accordance with FIG. 1. The protective diode 4 is situated laterally alongside the organic layer sequence 3 having the active layer 30. In comparison with the organic layer sequence 3, the protective diode 4 occupies only a small proportion of area at the main side 11 of the carrier substrate 1. An area of the organic layer sequence 3 is, for example, more than 50 cm$^2$ or more than 100 cm$^2$. An area of the protective diode 4 is, for example, between 1 mm$^2$ and 1 cm$^2$ inclusive.

In accordance with FIGS. 1 and 2, the protective diode 4 is embodied as a diode which comprises the two doped layers n, p and which is connected in antiparallel with respect to the organic layer sequence 3. In this case, the protective diode 4 has a breakdown voltage which is greater than the forward operating voltage with which the organic light-emitting diode 10 is operated in use as intended. For setting the breakdown voltage, the layers p, n of the protective diode 4 can be formed from the same materials or else from different materials with respect to the organic layer sequence 3. Moreover, the protective diode 4 can have different dopings than the organic layer sequence 3. Thicknesses of the layers p, n of the protective diode 4 and of the organic layer sequence 3 are in each case preferably between 20 nm and 350 nm inclusive.

Preferably, the organic light-emitting diode 10 comprises an encapsulation for protection against environmental influences. The encapsulation is not shown in any of the figures. Such an encapsulation can be constructed in the manner described in the document US 2009/0066240 A1. The disclosure content of said document is incorporated by reference.

Figure 3:
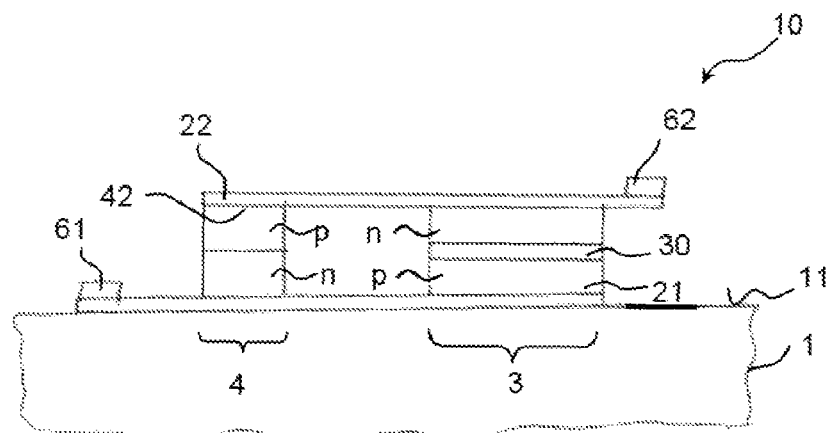
FIGS. 3 and 4 show schematic sectional illustrations of further exemplary embodiments of organic light-emitting diodes described here.

A further exemplary embodiment of the organic light-emitting diode 10 is illustrated schematically in FIG. 3. The order of the layers n, p is interchanged in the protective diode 4, in comparison with the organic layer sequence 3. Therefore, the first electrode is situated in each case between the carrier substrate 1 and the layer stack having the layers n, p of the protective diode 4 and of the organic layer sequence 3.

The second electrode 22 is mounted in each case at sides of the protective diode 4 and of the organic layer sequence 3 which face away from the carrier substrate 1. A thickness of the layer stack of the protective diode 4 is preferably approximately equal to a thickness of the organic layer sequence 3. The layer stack of the protective diode 4 and also the organic layer sequence 3 are intersected by a plane parallel to the main side 11 of the carrier substrate 1. Said plane, not depicted in FIG. 3, is oriented perpendicularly to the plane of the drawing.

Figure 4:
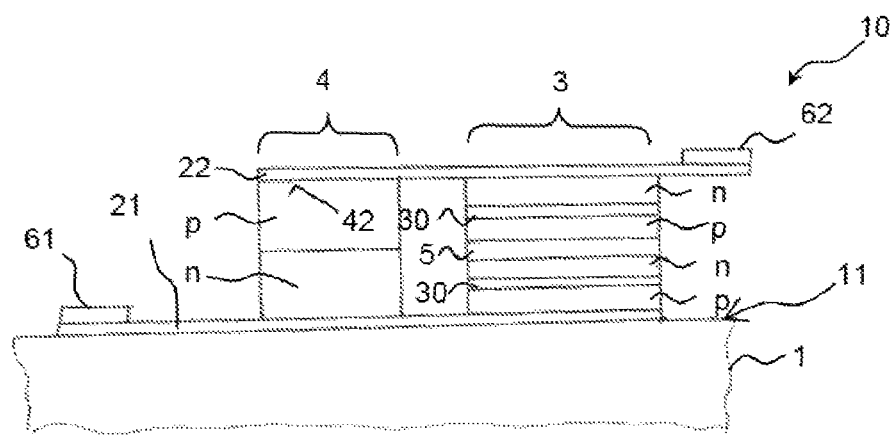

A further exemplary embodiment of the organic light-emitting diode 10 is illustrated in FIG. 4. The organic layer sequence 3 has two active layers 30, wherein more than the two active layers 30 depicted may also be present. A charge generation layer 5 is optionally situated between the active layers 30. The arrangement of the electrodes 21, 22 substantially corresponds to the arrangement of the electrodes 21, 22 in accordance with FIG. 3.

The optional charge generation layer 5 can be formed by an individual layer or else by a combination of a plurality of layers. In particular, the charge generation layer 5 is based on at least one undoped organic material or consists of at least one such material. The charge generation layer 5 can likewise be formed by a thin metal layer.

The protective diode 4 has the doped layers n, p. An order of said layers n, p is interchanged in comparison with the corresponding layers n, p which respectively adjoin one of the active zones 30. However, since the organic layer sequence 3 has a plurality of the n-doped layers n and a plurality of the p-doped layers p, the layers n, p of the protective diode 4 can be produced at the same time as the layers n, p from the organic layer sequence 3. This simplifies the production of the protective diode 4, in comparison for instance with the organic light-emitting diode 10 in accordance with FIG. 3. Furthermore, in the case of the exemplary embodiment in accordance with FIG. 4, the construction of the electrodes 21, 22 is simplified, compared for instance with the organic light-emitting diode 10 in accordance with FIG. 1.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An organic light-emitting diode-comprising:
   a carrier substrate,
   a first electrode, which is mounted at the carrier substrate,
   an organic layer sequence having at least one active layer for generating an electromagnetic radiation at a side of the first electrode which faces away from the carrier substrate,
   a second electrode at a side of the organic layer sequence which faces away from the carrier substrate, and
   a protective diode designed for protection against damage from electrostatic discharges,
   wherein the protective diode is mounted on the carrier substrate and is situated at the same main side as the organic layer sequence,
   wherein the protective diode is mounted laterally alongside the organic layer sequence on the carrier substrate, and
   wherein the protective diode comprises an organic layer stack and at least partly comprises the same materials or at least partly consists of the same materials as the organic layer sequence.

2. The organic light-emitting diode according to claim 1, wherein at least two layers of the layer stack of the protective diode are applied on the carrier substrate in an opposite order to that which is the case in the organic layer sequence having the active layer.

3. The organic light-emitting diode according to claim 2, wherein the layer stack of the protective diode is mounted between a partial region of the first electrode and a partial region of the second electrode, wherein the corresponding partial region of the first electrode is situated between the carrier substrate and the protective diode.

4. The organic light-emitting diode according to claim 1, wherein at least two layers of the layer stack of the protective diode are mounted on the carrier substrate in the same order as in the organic layer sequence having the active layer.

5. The organic light-emitting diode according to claim 4, wherein the first electrode is electrically connected to a top side of the protective diode facing away from the carrier substrate or extends over the top side of the protective diode.

6. The organic light-emitting diode according to claim 1, wherein both the organic layer sequence having the active layer and the protective diode each comprise at least one or exactly one n-doped and at least one p-doped layer, wherein the protective diode is free of an active layer provided for generating radiation.

7. The organic light-emitting diode according to claim 1, wherein the organic layer sequence comprises at least two active layers, wherein a charge generation layer is situated between two neighboring active layers.

8. The organic light-emitting diode according to claim 7, wherein the protective diode comprises or consists of the same material or the same materials as the charge generation layer.

9. The organic light-emitting diode according to claim 1, wherein a thickness of the layer stack of the protective diode, in a direction away from the carrier substrate, with a tolerance of at most 50%, is equal to a thickness of the organic layer sequence having the active layer.

10. The organic light-emitting diode according to claim 1, wherein there is at least one plane parallel to the main side of the carrier substrate which intersects both the layer stack of the protective diode and the organic layer sequence.

11. The organic light-emitting diode according to claim 1, which, apart from the exactly one protective diode, is free of further devices for protection against damage resulting from electrostatic discharges.

12. The organic light-emitting diode according to claim 1, wherein a thickness of the layer stack of the protective diode is approximately equal to a thickness of the organic layer sequence.

13. An organic light-emitting diode comprising:
a carrier substrate,
a first electrode, which is mounted at the carrier substrate,
an organic layer sequence having at least one active layer for generating an electromagnetic radiation at a side of the first electrode which faces away from the carrier substrate,
a second electrode at a side of the organic layer sequence which faces away from the carrier substrate, and
a protective diode designed for protection against damage from electrostatic discharges, wherein
    the protective diode is mounted on the carrier substrate and is situated at the same main side as the organic layer sequence,
    the protective diode is mounted laterally alongside the organic layer sequence on the carrier substrate,
    the protective diode comprises an organic layer stack and at least partly comprises the same materials or at least partly consists of the same materials as the organic layer sequence, and
    at least two layers of the layer stack of the protective diode are mounted on the carrier substrate in the same order as in the organic layer sequence having the active layer.

* * * * *